United States Patent [19]

Garza et al.

[11] Patent Number: 4,891,303

[45] Date of Patent: Jan. 2, 1990

[54] TRILAYER MICROLITHOGRAPHIC PROCESS USING A SILICON-BASED RESIST AS THE MIDDLE LAYER

[75] Inventors: Cesar M. Garza, Plano; Monte A. Douglas, Coppell; Roland Johnson, Sachse, all of Tex.

[73] Assignee: Texas Instruments Incorporated, Dallas, Tex.

[21] Appl. No.: 199,087

[22] Filed: May 26, 1988

[51] Int. Cl.⁴ ................................................ G03C 5/16
[52] U.S. Cl. .................................... 430/312; 430/316; 430/317; 156/643
[58] Field of Search ............... 430/312, 313, 316, 317, 430/394; 156/643

[56] References Cited

U.S. PATENT DOCUMENTS

| | | | |
|---|---|---|---|
| 4,665,006 | 5/1987 | Sachdev et al. | 430/270 |
| 4,692,205 | 8/1987 | Sachdev et al. | 156/643 |
| 4,732,841 | 3/1988 | Radigan | 430/311 |
| 4,738,916 | 4/1988 | Namatsu et al. | 430/272 |
| 4,761,464 | 8/1988 | Zeigler | 528/30 |
| 4,770,739 | 9/1988 | Orvek et al. | 156/643 |
| 4,788,127 | 11/1988 | Bailey et al. | 430/192 |
| 4,820,788 | 4/1989 | Zeigler | 528/33 |

FOREIGN PATENT DOCUMENTS

| | | | |
|---|---|---|---|
| 152629 | 8/1984 | Japan | 430/312 |
| 47419 | 3/1985 | Japan | 430/312 |
| 228625 | 10/1986 | Japan | 430/312 |

*Primary Examiner*—Jose G. Dees
*Attorney, Agent, or Firm*—Douglas A. Sorensen; Rodney M. Anderson; Melvin Sharp

[57] ABSTRACT

A method for patterning an integrated circuit workpiece (10) includes forming a first layer (16) of organic material on the workpiece surface to a depth sufficient to allow a substantially planar outer surface (36) thereof. A second, polysilane-based resist layer (22) is spin-deposited on the first layer (16). A third resolution layer (24) is deposited on the second layer (22). The resolution layer (24) is selectively exposed and developed using standard techniques. The pattern in the resolution layer (24) is transferred to the polysilane layer (22) by either using exposure to deep ultraviolet or by a fluorine-base RIE etch. This is followed by an oxygen-based RIE etch to transfer the pattern to the surface (18) of the workpiece (10).

13 Claims, 1 Drawing Sheet

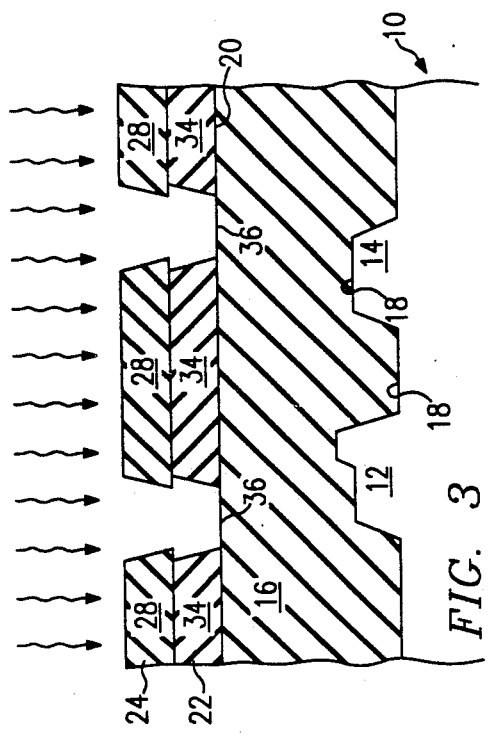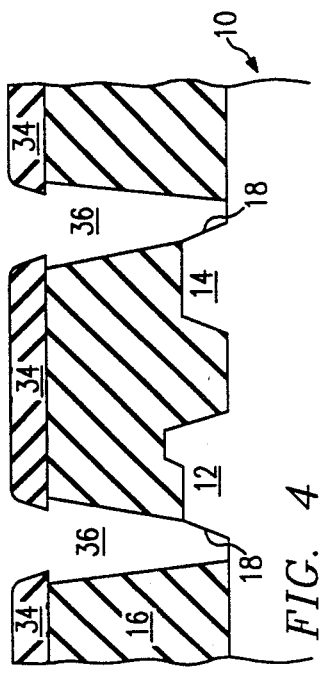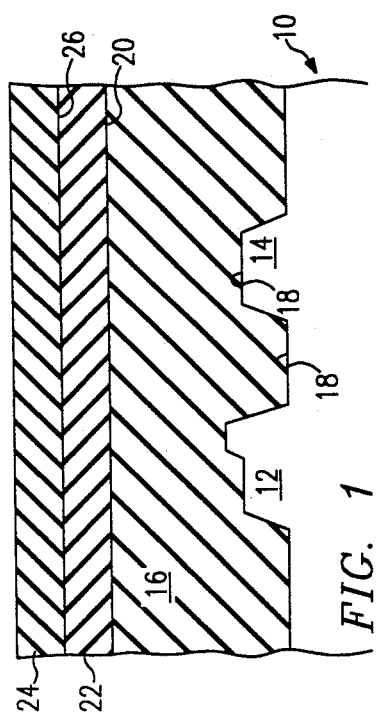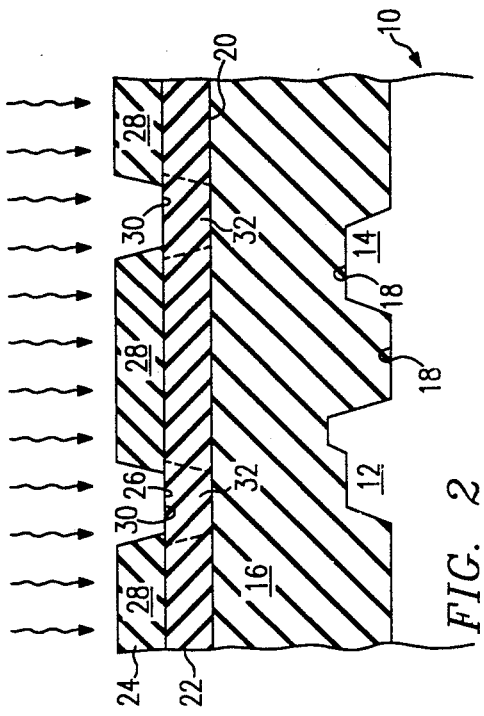

TRILAYER MICROLITHOGRAPHIC PROCESS USING A SILICON-BASED RESIST AS THE MIDDLE LAYER

TECHNICAL FIELD OF THE INVENTION

This invention relates in general to microlithography, and in particular to a trilayer microlithographic process.

BACKGROUND OF THE INVENTION

As the devices forming integrated circuits have become smaller, the topography of semiconductor slices during intermediate stages of fabrication has worsened. This in turn has led to problems in patterning integrated circuit workpiece surfaces with extreme topography by means of a single photoresist layer.

To meet this problem, bilayer and trilayer photoresist systems have been developed. D. Hoffer et al. ("Advances in Resist Technology" SPIE, Vol. 469 (1984)) report a silicon-based polymer as a deep-ultraviolet, positive resist. They also report that silicon-based resists can act as excellent reactive ion etch (RIE) barriers in an oxygen plasma. They used a mid-ultraviolet (313 nm) projection tool to expose the resist.

Workers in the art have reported trilayer processes that use a two-stage etch process to pattern a bottom layer. However, these trilayer processes use a middle layer that is plasma-deposited and that is usually inorganic in nature. Standard multi-layer photographic techniques have problems in throughput rate, complication of processing, uniformity control, cleanliness, layer cracking and removal of the deposited layers. A need has therefore arisen for a trilayer photolithograhic process that has improved throughput and quality control characteristics as opposed to conventional trilayer processes.

SUMMARY OF THE INVENTION

One aspect of the present invention comprises a process for applying a pattern to an integrated circuit workpiece. A first layer of organic material is formed on an integrated workpiece surface to a depth sufficient to allow an outer surface of the first layer to be substantially planar. A second layer is then deposited on the first layer, preferably by spin-deposition. This second layer contains a polymer having silicon among its chain atoms, and is preferably selected from the polysilanes, the polysiloxanes and the organosilicon compounds. A third layer of organic photoresist is formed on the second layer. The third layer is exposed to a light source to which it is sensitive, such as a g-line (436 nm) stepper in the case of standard Novolak photoresist. This third, resolution layer is developed to remove the exposed portions thereof and to create corresponding orifices through it to the outer surface of the second layer. Portions of the second layer in registry with the orifices in the resolution layer are next removed. This can be performed either by a fluorine-based reactive ion etch (RIE), or by subjecting the exposed portions of the second layer to a deep ultraviolet wavelength shorter than or equal to 340 nm. The silicon-based polymer forming the second layer is sensitive to this deep U.V. radiation, and causes the solubility of the exposed portions of the second layer to increase. After exposure to deep U.V., the second layer is developed. Finally, exposed portions of the first layer are anisotropically etched using an etchant that differentially etches the first layer at a much faster rate than the second layer, such as an oxygen-based RIE etch. A highly satisfactory patterning of the integrated circuit workpiece surface results.

The present invention exhibits superior characteristics to conventional trilayer processes in terms of increased throughput, process simplification, quality control relating to the uniformity of the deposited material, cleanliness, less cracking, and easier removal of the spun-on silicon polymer.

BRIEF DESCRIPTION OF THE DRAWINGS

Other aspects of the invention and their advantages will be discerned after studying the detailed description in conjunction with the drawings in which:

FIGS. 1–4 are greatly enlarged schematic sectional views of an integrated circuit workpiece illustrating various steps in the multilayer photolithographic process of the invention.

DETAILED DESCRIPTION

Referring first to FIG. 1, an integrated circuit workpiece is shown in a greatly enlarged schematic cross-section, and is indicated generally at 10. Workpiece 10 has a non-uniform topography that is represented schematically by eminences 12 and 14.

In the process according to the invention, a thick layer 16 of standard Novolak photoresist is deposited over an outer surface 18 of workpiece 10. Layer 16 can also be constituted by any organic layer that is etchable by an outer ion etchant that does not attack silicon-based resist layers, such as oxygen, hydrogen and nitrous oxide RIE etchants. Layer 16 is preferably deposited to a thickness of 1 to 3 microns such that an upper surface 20 thereof is substantially planar. Planar surface 20 assures that the image to be patterned on outer surface 18 will be correctly focused. One such standard Novolak photoresist that can be used is Shipley 1400 series resist.

Next, a relatively thin layer 22 of silicon-based resist is deposited on upper surface 20 of resist layer 16. Layer 22 can comprise any silicon-based polymer that is resistant to oxygen, hydrogen or nitrous oxide RIE etches, and can comprise, for example, polysilanes, polysiloxanes, organosilicon compounds or mixtures of these. It is also important that the selected silicon-based layer 22 be sensitive to deep ultraviolet radiation of wavelengths less than 340 nm. A particularly preferred layer 22 includes a methyl-propyl, methyl-isopropyl polysilane, in a ten percent xylene solution as a carrier. The formula of this preferred polymer is as follows:

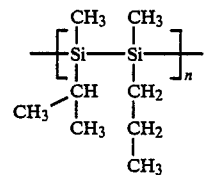

Although this silicon-based resist can be deposited by plasma deposition, it has been found that a spin-deposition of layer 22 is cleaner and makes layer 22 easier to remove. The thickness of layer 22 preferably should be in the range of 0.2 to 0.5 microns.

A third, resolution layer 24 of standard Novolak photoresist is deposited on an outer surface 26 of layer 22. Photoresist layer 24 can be comprised of any standard organic photoresist that is sensitive to standard photolithographic wavelengths, such as the g-line of mercury at 436 nm. Layer 24 should be deposited to a thickness in the range of approximately 0.5 microns.

Turning now to FIG. 2, a photolithographic pattern is used to selectively expose layer 24, making the exposed areas susceptible to standard developing solvents such as strong basic solutions. The development of layer 22 leaves portions 28 of layer 24 and exposed areas 30 on the upper surface 26 of layer 22.

In one embodiment of the invention, the workpiece is next exposed to a deep ultraviolet wavelength to which layer 22 is sensitive, but which is strongly absorbed by portions 28. This wavelength or wavelengths should be shorter than or equal to 3400 angstroms. A particularly preferred deep ultraviolet light has wavelengths shorter than or equal to 248 nm. The exposure to deep ultraviolet produces areas 32, as delimited by dashed boundaries, of layer 22. Inside areas 32, many silicon bonds within the polymer chains have been broken, making portions 32 more susceptible to solvents than the surrounding portions of layer 22.

Turning now to FIG. 3, layer 22 has been developed with an organic solvent that should contain elements of both polar and non-polar types, such as cyclohexane and acetone. The development of layer 22 leaves masking portions 34 thereof and exposes areas 36 of the upper surface 20 of thick resist layer 16.

The workpiece is next subjected to a reactive ion etch (RIE) that differentially etches layer 16 at a much faster rate than silicon-based masking portions 34. Such etchants can be selected from plasmas made from oxygen, hydrogen or nitrous oxide. A particularly preferred etchant step involves the use of an oxygen RIE etch. This etch will react with the silicon in masking portions 34 to create an $SiO_2$ crust (not shown) that is relatively impervious to the RIE etchant. As the etch is anisotropic, masking portions 34 act to protect the regions of thick layer 16 underneath them.

Turning now to FIG. 4, the result of an oxygen RIE etch is shown, in which orifices 38 have been created to extend from outer surface 20 of thick layer 16 down to the outer surface 18 of integrated circuit workpiece 10. Meanwhile, portions 34 have been relatively resistant to the oxygen RIE etch, and are only slightly etched away.

In an alternative embodiment (not shown), the exposure of layer 22 to deep ultraviolet light, as is shown in FIG. 2, is replaced with a fluorine-based RIE etch. A fluoride-containing gas such as $NF_3$ can be used to generate the plasma etchant. In this alternative embodiment, the fluorine-based etchant is used to transfer the pattern from the resolution layer 28 downward through layer 22 such that areas 36 on the top surface 20 of thick layer 16 (FIG. 3) are exposed. Then, the fluorine-based etchant gas is replaced with oxygen in the same reactor, and the etch is continued in situ until the profile shown in FIG. 4 results. To confirm the advantages of the process, a pair of experiments were performed as detailed below.

EXAMPLE I

A thick layer of standard Novolak resist was deposited as the planarizing bottom layer on a semiconductor workpiece. Next, 2 to 3 ml of methyl-propyl, methyl-isopropyl polysilane in a 10% xylene solution was spin-coated onto the resist layer at 2000 and also at 4000 rpm on a manual spinner. The resultant thicknesses were 0.6 and 0.4 micrometers, respectively. The thickness was measured in a GCA nanospec instrument using a refraction index of 1.60/1.67 as measured with a helium-neon laser ellipsometer. The reference index was 1.60 at 0.6 micrometers and was 1.67 at 0.4 micrometers.

A thin resolution layer of Shipley 1400-17 Novolak resist was deposited on the polysilane layer. The resolution layer was exposed with a GCA g-line (436 nm) stepper and developed with a tetramethyl ammonium hydroxide solution. The workpiece was then exposed with deep ultraviolet light from a Nikon I-line 365 nm stepper. The polysilane layer was developed with a solvent containing cyclohexane and acetone. Finally, the workpiece was subjected to an oxygen RIE etch in transferring the pattern to the bottom layer using the polysilane resist as a mask. An eminently satisfactory patterning of the semiconductor workpiece surface was achieved.

EXAMPLE II

The experiment was conducted as above, except that in the place of exposing the polysilane layer to deep ultraviolet light, the workpiece was subjected to a fluoride RIE etch using $NF_3$ as the gas for the plasma. While the workpiece was in the same reactor, the gas etchant was switched over to oxygen to continue the etch in situ into the bottom thick layer using the polysilane resist as a mask. A satisfactory patterning of the semiconductor workpiece surface was once again achieved.

In summary, an advantageous trilayer photolithographic process has been disclosed that features the use of a spun-on silicon-based polymer as the middle layer. The trilayer photolithographic process of the invention confers significant advantages in terms of high resolution, increased through-put and better uniformity.

While preferred embodiments of the invention and their advantages have been disclosed in the above detailed description, the invention is not limited thereto but only by the spirit and scope of the appended claims.

What is claimed is:

1. A process for applying a pattern to a workpiece used in fabricating an integrated circuit, comprising the steps of:
   depositing a thick organic layer on a surface of the workpiece;
   depositing a second layer containing an at least partially silicon-based polymer on the thick organic layer;
   depositing an organic photoresist resolution layer on the second layer;
   projecting a pattern image onto the resolution layer with a light source to which the resolution layer is sensitive;
   developing the resolution layer to leave patterned orifices therethrough and to expose patterned areas of the outer surface of the second layer;
   exposing the resolution layer and the patterned areas of the second layer to light to which the second layer is sensitive but which will be strongly absorbed by the resolution layer;
   developing the second layer to create orifices therein extending from the patterned areas of the outer surface of the second layer to corresponding patterned areas on the outer surface of the thick organic layer; and differentially etching exposed portions of the thick organic layer much faster than the second layer until the surface of the workpiece is reached.

2. The process of claim 1, wherein said step of depositing a thick organic layer comprises the step of depositing a layer of Novolak photoresist.

3. The process of claim 1, and further comprising the step of depositing the thick organic layer to a depth in the range from about 1 to about 3 microns.

4. The process of claim 1, wherein said silicon-based polymer is selected from the group consisting of polysilanes, polysiloxanes, organosilicon compounds, and mixtures thereof.

5. The process of claim 1, and further comprising the step of absorbing wavelengths of light less than or equal to 340 nm by the second layer.

6. The process of claim 5, wherein said step of exposing the organic photoresist layer and the patterned areas of the second layer comprises the step of exposing the resolution layer and the patterned areas of the second layer to deep ultraviolet light having a wavelength less than or equal to about 248 nm.

7. The process of claim 1, and further comprising the step of depositing the second layer to a depth in the range of about 0.2 microns to about 0.5 microns.

8. The process of claim 1, wherein the resolution layer comprises Novolak photoresist.

9. The process of claim 1, and further comprising the step of absorbing wavelengths of light less than or equal to 248 nm by the resolution layer during said step of exposing the organic photoresist layer and the patterned areas of the second layer.

10. The process of claim 1, and further comprising the step of depositing the resolution layer to a thickness of about 0.9 microns.

11. The process of claim 1, wherein said step of differentially etching comprises the step of etching the exposed portions of the thick organic layer with a reactive ion etch that attacks the thick organic layer at a much faster rate than the second layer.

12. The process of claim 11, and further comprising the step of creating a plasma etchant from a gas selected from the group consisting of oxygen, hydrogen and nitrous oxide.

13. The process of claim 12, wherein said gas comprises oxygen.

* * * * *